(12) United States Patent
Dickey et al.

(10) Patent No.: US 10,234,829 B2
(45) Date of Patent: Mar. 19, 2019

(54) MULTI-CHANNEL CURRENT BALANCING SYSTEM INCLUDING PARALLEL SOLID-STATE POWER CONTROLLERS

(71) Applicant: Hamilton Sundstrand Corporation, Charlotte, NC (US)

(72) Inventors: John A. Dickey, Caledonia, IL (US); Josh C. Swenson, Rockford, IL (US); Donald G. Kilroy, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 804 days.

(21) Appl. No.: 14/706,016

(22) Filed: May 7, 2015

(65) Prior Publication Data

US 2016/0327917 A1 Nov. 10, 2016

(51) Int. Cl.
*G05B 9/02* (2006.01)
*H02J 1/10* (2006.01)
*H02J 3/00* (2006.01)
*H02J 3/38* (2006.01)
*H03K 17/12* (2006.01)

(52) U.S. Cl.
CPC ............... *G05B 9/02* (2013.01); *H02J 1/10* (2013.01); *H02J 3/005* (2013.01); *H02J 3/006* (2013.01); *H02J 3/38* (2013.01); *H03K 17/122* (2013.01); *H02J 2001/106* (2013.01)

(58) Field of Classification Search
CPC ....... G05B 9/02; H02J 1/10; H02J 3/38; H02J 3/006; H02J 2001/106; H03K 17/122
See application file for complete search history.

(56) References Cited

U.S. PATENT DOCUMENTS

| 4,618,779 A | 10/1986 | Wiscombe |
| 5,592,394 A * | 1/1997 | Wiscombe ............... H02J 1/10 307/31 |
| 8,704,574 B2 | 4/2014 | Prabhuk et al. |
| 8,847,656 B1 | 9/2014 | A et al. |

(Continued)

FOREIGN PATENT DOCUMENTS

| EP | 2523294 A1 | 11/2012 |
| WO | 9718612 A1 | 5/1997 |

OTHER PUBLICATIONS

Search Report for European Patent Application No. 16168558.1, Application Filing Date May 6, 2016; dated Oct. 4, 2016. 10 pages.

(Continued)

*Primary Examiner* — Jared Fureman
*Assistant Examiner* — Michael Warmflash
(74) *Attorney, Agent, or Firm* — Cantor Colburn LLP

(57) ABSTRACT

A system balances current flowing through a solid-state power controller system including at least two output channels connected in parallel. The system delivers a first current to a load via a first output channel to a load, and delivers a second current to the load via a second output channel connected in parallel with the first output channel. The system further determines a first strength of the first current and a second strength of the second current, and adjusts at least one of a first resistance of the first output channel and a second resistance of the second output channel such that the first current strength is substantially equal to the second current strength.

20 Claims, 5 Drawing Sheets

(56) References Cited

U.S. PATENT DOCUMENTS

| | | | |
|---|---|---|---|
| 2004/0051383 A1* | 3/2004 | Clark, Jr. | H02J 1/10 |
| | | | 307/36 |
| 2012/0292999 A1 | 11/2012 | Henkel et al. | |
| 2013/0140892 A1* | 6/2013 | Simper | H02J 4/00 |
| | | | 307/31 |
| 2014/0203639 A1 | 7/2014 | Rozman et al. | |
| 2014/0217821 A1* | 8/2014 | Rozman | H02J 1/14 |
| | | | 307/29 |
| 2015/0076910 A1* | 3/2015 | Wang | H02M 3/156 |
| | | | 307/52 |
| 2016/0056141 A1* | 2/2016 | Dickey | H01L 27/0255 |
| | | | 361/91.5 |
| 2016/0149400 A1* | 5/2016 | Dickey | H02J 1/10 |
| | | | 361/93.1 |

OTHER PUBLICATIONS

Office Action for European Patent Application No. 16168558.1, Application Filing Date May 6, 2016; dated May 11, 2018. 8 pages.

\* cited by examiner

MULTI-CHANNEL CURRENT BALANCING SYSTEM INCLUDING PARALLEL SOLID-STATE POWER CONTROLLERS

TECHNICAL FIELD

The present disclosure relates to solid-state power controllers and their components, and more particularly, to balancing parallel solid-state power controller channel currents.

BACKGROUND

Solid-state power controllers ("SSPC") have been designed to have a current channel that can be used individually or combined with current channels of other SSPCs to achieve a desired current capacity. However when paralleling, the individual channels may experience different conditions such as, for example, in the event that outrush current demands vary or component values including board parasitics vary to a sufficient degree to create a current imbalance or wiring resistance varies from channel to channel. Some channels may become overloaded while other channels may remain within operating specifications. In some instances, this results in possible overloading of one or more circuits, trip coordination complexity, and other factors, such as thermal "hot spots."

Conventional SSPC systems designs have attempted to balance the current flowing through the SSPC channels by matching field effect transistor ("FET") values and/or matching trace line lengths to naturally approximately balance in the current loading between channels.

SUMMARY

According to a non-limiting embodiment, a solid-state power controller system comprises a power source, at least one solid-state power controller, and an electronic controller. The power source includes at least two output channels connected in parallel. The at least two output channels include a first output channel configured to deliver a first current therethrough to a load, and a second output channel configured to deliver a second current therethrough to the load. The second output channel is connected in parallel with the first output channel. The at least one solid-state power controller includes at least one first main control transistor, at least one first electronic balancing device, at least one second main control transistor, and at least one second electronic current balancing device. The at least one first main control transistor is connected in series along the first output channel to control the first current output to the load. The at least one first electronic current balancing device is configured to regulate current delivered to the at least one first main control transistor. The at least one second main control transistor is connected in series along the second output channel to control the second current output to the load. The at least one second electronic current balancing device is configured to regulate current delivered to the at least one second main control transistor. The electronic controller is in electrical communication with the first solid-state power controller and the second solid-state power controller to determine a strength of the first and second currents. The electronic controller further controls at least one of the at least one first electronic current balancing device and the at least one second electronic current balancing device to maintain that the first current flowing through the first channel is substantially equal to the second current flowing through the second channel.

According to another non-limiting embodiment, a method is provided to balance current flowing through a solid-state power controller system including at least two output channels connected in parallel. The method comprises delivering a first current to a load via a first output channel to a load, and delivering a second current to the load via a second output channel connected in parallel with the first output channel. The method further includes determining a first strength of the first current and a second strength of the second current. The method further includes adjusting at least one of a first resistance of the first output channel and a second resistance of the second output channel such that the first current strength is substantially equal to the second current strength.

BRIEF DESCRIPTION OF THE DRAWINGS

The subject matter of the disclosure is particularly pointed out and distinctly claimed in the claims at the conclusion of the specification. The foregoing and other features of the various embodiments are apparent from the following detailed description taken in conjunction with the accompanying drawings in which:

DETAILED DESCRIPTION OF THE INVENTION

According to various embodiments described herein, a multi-channel platform balancing parallel SSPC channel current system is provided. The multi-channel platform balancing parallel SSPC channel current system is configured to operate according to both analog control systems using a single sharing FET operated in a linear mode, for example, and digital control using a plurality of sharing FETs that can be individually enabled via a digital microcontroller, for example. The sharing FETs used for both analog control and digital control can be connected at various locations in series between the source and load. In addition, various embodiments described herein provide a multi-channel platform balancing parallel SSPC channel current system that is configured to operate with either N channel or P channel FETs depending on the optimum configuration to match the local supply and selected supply reference. For example, a multi-channel platform balancing parallel SSPC channel current system is configured to operate either a P-channel sharing FET with a local supply that is negative relative to the feed input (e.g., the main feed power supply) or an N-channel sharing FET with a local supply that is positive relative to the feed input, independently of how or what controls the main SSPC switch that is in series with the sharing FET(s). At least one embodiment also provides a multi-channel platform balancing parallel SSPC channel current system capable of being digitally controlled instead of controlled using a digital-to-analog converter or other type analog control loop.

Various embodiments of the multi-channel platform balancing parallel SSPC channel current system recited herein provide additional technical features including, for example, allowing both a current sensing device (e.g., a current sensing resistor) and the sharing control functions to remain at low voltage differences with respect to the main feed line. In this manner, the controls can be feed-referenced and can all have low voltage ratings. As a result, only the main switching FET(s) On/Off control has to be level shifted or isolated in order to follow the load voltage when turned On/Off. According to at least one embodiment, a P-channel main FET is provided that is operated according to a DC source only, which allows all control operations to be low voltage control circuits and referenced to the line. Accordingly, this P-type configuration uses negative local supply voltages relative to the main feed line and P channel sharing FET(s). Therefore, when the AC and/or N channel FET(s) are utilized, the gate drive are controlled to be +5V to +10V above the feed input power supply.

Figure 1:
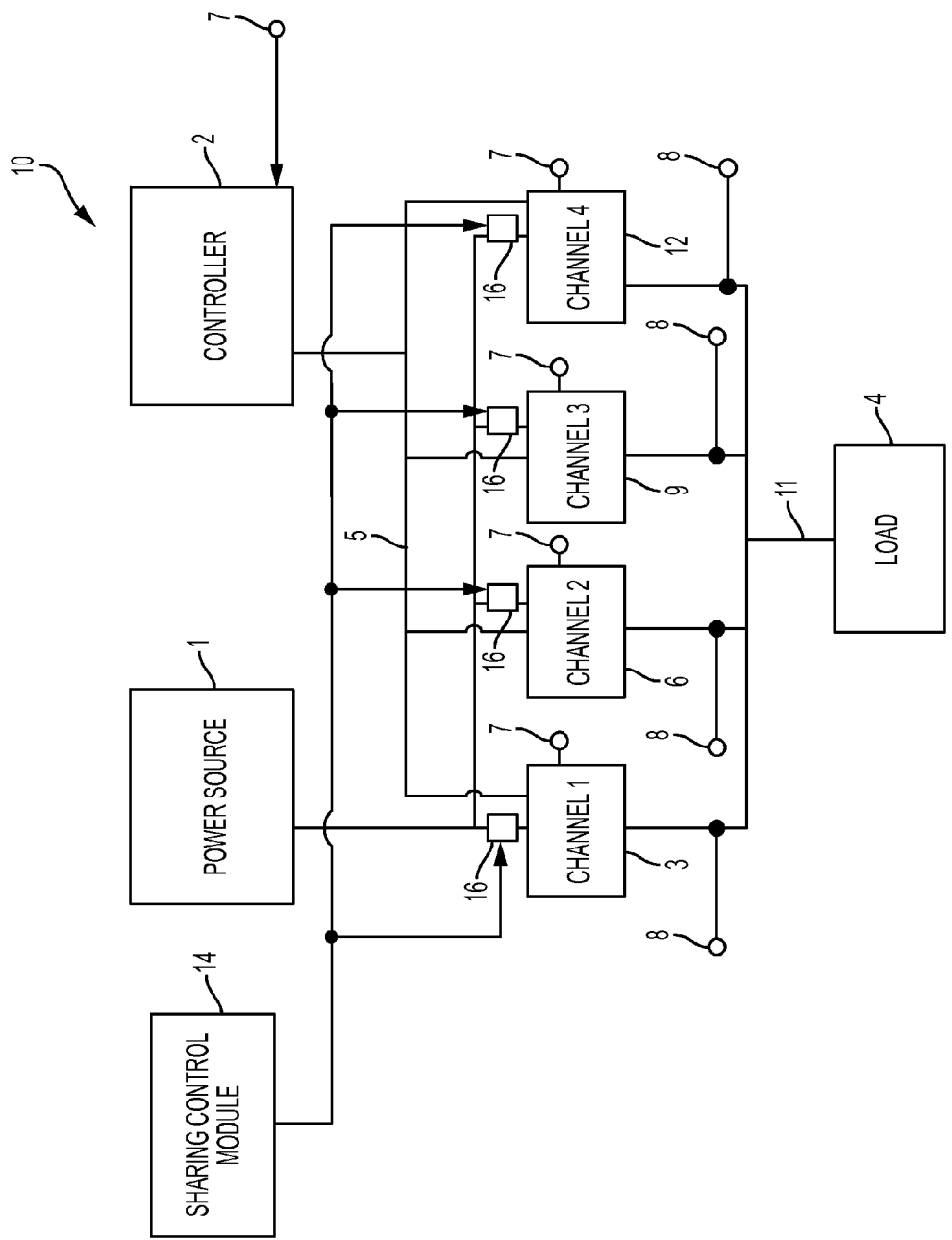
FIG. 1 illustrates a SSPC system comprising multiple SSPCs coupled in parallel having individual channels in accordance with various embodiments.

Referring now to FIG. 1, a multi-channel platform balancing parallel SSPC system 10 comprising multiple SSPCs that selectively enable respective SSPC channels 3, 6, 9, 12 coupled in parallel is illustrated according to a non-limiting embodiment. Although four channels are shown, it should be appreciated the system is not limited thereto. The multi-channel platform balancing parallel SSPC system 10 comprise a system whereby electrical power is provided for use by a load 4. Moreover, multi-channel platform balancing parallel SSPC system 10 may condition the electrical power so that its current and voltage remains within defined boundaries and may protect itself, and/or the load 4, by preventing the current from unwanted deviations. For instance, the multi-channel platform balancing parallel SSPC system 10 may comprise one or more channels, such as channel 1 (3), channel 2 (6), channel 3 (9), channel 4 (12), coupled in parallel whereby the sensed channel voltage output 8 and/or the channel current output 7 may be controlled. According to a non-limiting embodiment, the parallel connections can be achieved through connections established using an aircraft harness connector.

In various embodiments and with continued reference to FIG. 1, the multi-channel platform balancing parallel SSPC system 10 may comprise a power source 1, a controller 2, and SSPCs comprising channel 1 (3), channel 2 (6), channel 3 (9), channel 4 (12). The power source 1 may provide electrical power via a channel to one or more SSPCs. Each SSPC can then selectively output the power to load 4 in response to receiving a control signal 5 comprising directions generated by controller 2, and in response to protective actions taken by the SSPC channels both independently and in response to the control signal 5.

The power source 1 may comprise any apparatus whereby electrical power may be provided. For example, the power source 1 may be a solid-state power supply. The power source 1 may be a linear power supply, or a switching-mode power supply, or a power supply operating according to a variety of different modes. The power source 1 may further comprise a generator, an alternator, a fuel cell, or another source of electrical energy and in various embodiments may be configured for aircraft use. For example, the power source 1 may comprise a generator mechanically connected with a turbine engine, such as an aircraft engine or an aircraft auxiliary power unit engine. The scalable SSPC systems 10 disclosed herein involve power sources 1 that provide AC channels (see FIGS. 2 and 4), or DC channels (see FIGS. 3 and 5).

The top level controller 2 may be configured to selectively enable or disable each output channel 3, 6, 9, 12. The multi-channel platform balancing parallel SSPC system 10 may include a power source 1 comprising a plurality of output channels 3, 6, 9, and 12 (also referred to herein as "channels") comprising a first output channel 3 and a second output channel 6. It should be appreciated that while 4 channels are shown, any number channels greater than 1 channel may be utilized.

As mentioned above, the multi-channel platform balancing parallel SSPC system 10 includes a first solid-state power controller 2 that generates a control signal to control the output of one or more of the channels 3, 6, 9 and 12. The selective operation may be achieved using one or more main channel transistors. For example, a first main channel transistor may be connected in series with the output of a respective channel 3, 6, 9 and 12, as discussed in greater detail below. The multi-channel platform balancing parallel SSPC system 10 may include a second solid-state power controller. A second main channel transistor may be connected to the second solid-state power controller, and may be coupled in series along a second output channel. The multi-channel platform balancing parallel SSPC system 10 may include a controller 2 in electrical communication with the first solid-state power controller and the second solid-state power controller, for example. Accordingly, operation of the first main channel transistor selectively enables and/or disables a respective first channel, e.g., channel 3, while the second main channel transistor selectively enables and/or disables a respective second channel, e.g., channel 6.

According to a non-limiting embodiment, a first channel 3 outputs a first power to a load 4, a second channel 6 outputs a second power to the load 4, a third channel 9 outputs a third power to the load 4, and the fourth channel 12 outputs a fourth power to the load 4. The electrical power may be combined by the various SSPCs. Each SSPC may receive a corresponding control signal 5 from the controller 2 that selectively enables and/or disables the respective SSPC. For example, the first SSPC may receive a first control signal, the second SSPC may receive a second control signal, the third SSPC may receive a third control signal, and the fourth SSPC may receive a fourth control signal. By controlling each SSPC, the controller 2 may logically combine SSPCs to distribute the amount of current drawn from each channel 3, 6, 9, and 12. A bidirectional communications linkage 5, may be configured to allow the controller 2 also to receive information, such as the present current load on a channel from the individual channels, such as the first channel 3, the second channel 6, the third channel 9, and/or the fourth channel 12. The outputs of one or more individual channels may be coupled via a wired linkage 11 to a load 4. The wire linkage 11 may establish parallel connections of channels 3, 6, 9 and 12 with respect to one another. Conventional SSPC systems assumed a single SSPC module could not be designed to accommodate different connections provided by different wire linkages 11. According to at least one embodiment of the present teachings, however, a multi-channel platform balancing parallel SSPC system 10 is provided that is compatible with multiple aircraft applications and different connections established by different wire linkages 11.

Further referencing FIG. 1, the multi-channel platform balancing parallel SSPC system 10 includes an electronic control sharing control module 14 and one or more electronic current balancing devices 16. The electronic current balancing devices include, for example, one or more sharing field effect transistors (FETs) as discussed in greater detail below. Each electronic current balancing device 16 is disposed on each channel (e.g., 3, 6, 9, 12) and is configured to realize a varied impedance that controls the overall resistance of the channel in response to a control signal output by the control sharing control module 14. The control sharing control module 14 generates one or more controls signals that control a respective current balancing device 16 based on a control algorithm, for example, the control algorithm can be one of a variety of schemes including one programmed to direct matching of currents (based on exchange of total or average current of the other parallel channels) or for example act as a limiter to direct a parallel channel not to exceed a locally controlled current and/or time-current curve. Stated another way, the control algorithm may be configured to direct current matching between a first channel e.g., channel 3, and a second, e.g., channel 6. According to various embodiments, the control algorithm is configured to utilize the average current of a first current measured over the first channel and a second current measured over the second channel to direct current matching between the plurality of channels, e.g., the first channel 3 and the second channel 6. While shown as a separate control sharing control module 14, in various embodiments the sharing control function may also be combined with controller 2.

According to various embodiments, the control algorithm may be configured to utilize the total sum of current of a first current measured over a first channel, e.g., channel 3 and a second current measured over a second channel, e.g., channel 6, to direct current matching between the first output channel, the second output channel and/or any desired number of additional coupled channels.

Figure 2:
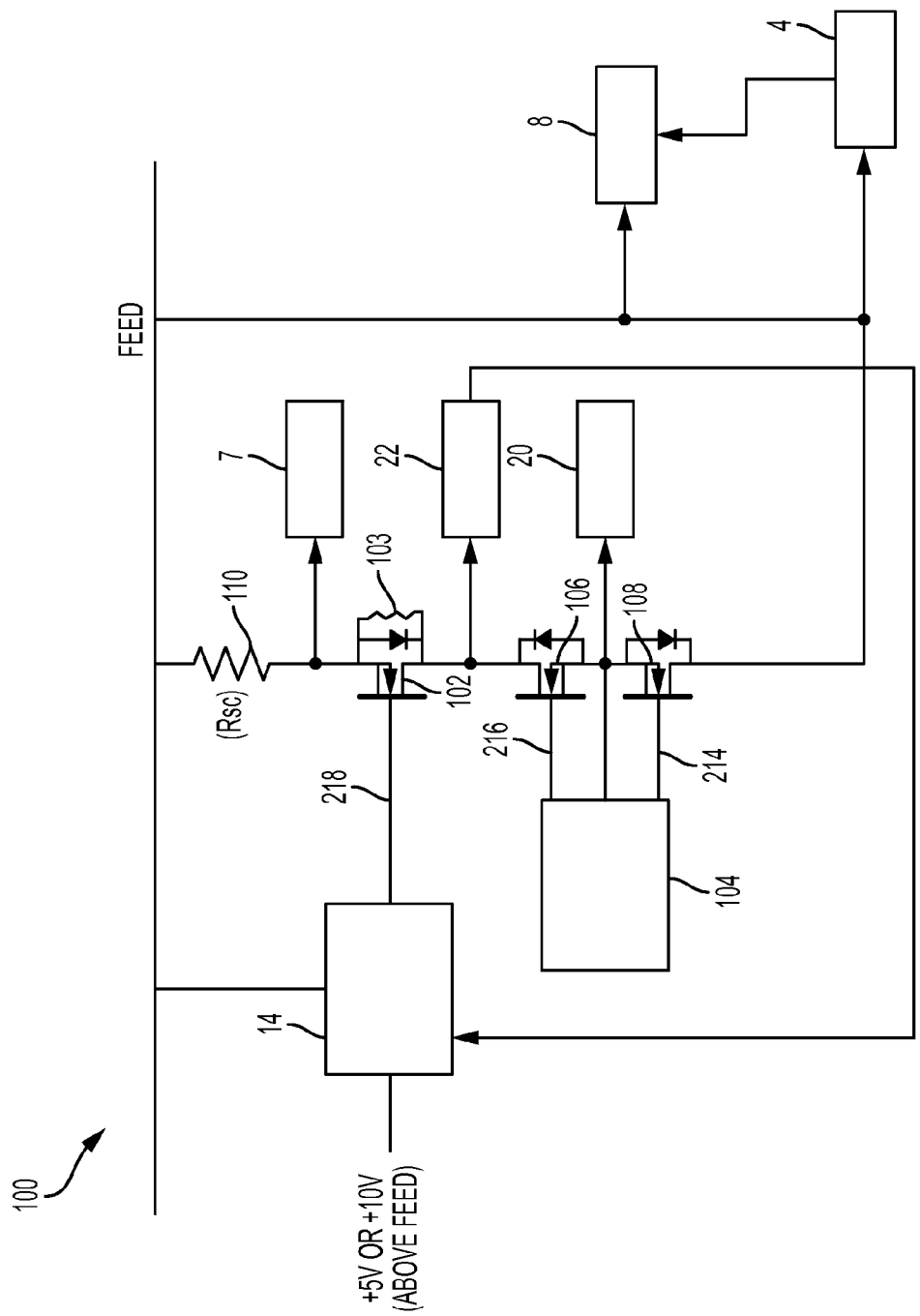
FIG. 2 is a schematic illustrating a multi-channel platform balancing parallel SSPC channel current system including an electronic analog sharing control unit that controls an impedance of a sharing field effect transmitter (FET) to control sharing of an individual AC SSPC according to a non-limiting embodiment.

Referring now to FIG. 2, a SSPC channel 100 including an analog-based current balancing device configured as a sharing FET 102 that provides selective current limiting is illustrated according to a non-limiting embodiment. The sharing FET 102 is illustrated as being connected in parallel with a sharing resistor 103, but it should be appreciated that the sharing resistor 103 may be omitted. Although only a single SSPC channel is illustrated, e.g., channel 3, it should be appreciated that channels 6, 9 and 12 may be constructed in a similar manner. The SSPC channel 100 comprises an electronic main channel controller 104, a first main channel transistor 106 and a second main channel transistor 108. The main channel transistors 106,108 may be configured as a p-channel FET, or an n-channel FET. Alternatively, other transistors such as bipolar junction transistors ("BJTs"), whether NPN or PNP, may be implemented, or other voltage-controlled switches or other current-controlled switches may be implemented without departing from the scope of the inventive teachings.

The main channel controller 104 directs the operation of a gate of the first main channel transistor 106 and a gate of the second main channel transistor 108 via a control algorithm. For example, the main channel controller 104 can generate a command signal 214 and a control loop output signal 216. In this manner, the gate voltage of the first main channel transistor 106 may be changed in response to the control loop output 216, while operation of the gate of the second main channel transistor 108 may be directed in response to the command signal 214.

According to an embodiment, the SSPC channel 100 may also include one or more measurement or sensing nodes. For example, the SSPC channel 100 may include a sensed channel current output node 7, a sensed channel voltage output node 8, and a main transistor voltage sensing node 20. The sensed channel current output node 7 measures current flowing through a current sense resistor 110, which is indicative of the current flowing through the SSPC channel 100. The sensed channel voltage output node 8 measures the voltage across the main power feed and the load 4, which is indicative of the voltage across the SSPC channel 100. The main transistor voltage sensing node 20 is connected between the first main channel transistor 106 and the second main channel transistor 108.

Various embodiments provide a multi-channel platform balancing parallel SSPC system that allows shared control over an individual SSPC channel 100 that operates in parallel with other SSPC channels (not shown in FIG. 2). In this manner, the local current flowing through the SSPC channel 100 can be assured that SSPC channel-currents coordinate correctly with respective secondary protection (not shown in FIG. 2), thereby promoting thermal balance between the power dissipation of the channels in the group. In addition, the channel-current coordination information can be stored locally as configuration data during module manufacture or configured during power-up sequencing. According to an embodiment, the channel-current coordination information can also be dynamically controlled by an algorithm to track a control parameter or maintain one side of a control parameter during, for example, active limiter operation.

The sharing FET 102 (in either an analog control embodiment or a digital control embodiment) can be connected at various locations in series between the source and load. For example, the sharing FET 102 can be connected in series between the power source (e.g., power feed), and one or more of the main channel transistors 106,108. According to another embodiment, the electronic current balancing device 102 are connected in series between the load 4, and one or more of the main channel transistors 106, 108. It should be appreciated that the sharing FET 102 can be located at additional locations including, but not limited to, above the current sense resistor 110, below the current sense resistor 110, etc.

The sharing FET 102 has a gate voltage-to-impedance characteristic. In this manner, the impedance of the sharing FET 102 can be adjusted in response to varying the gate voltage as discussed in greater detail below. A gain feedback sensing node 22 may also be provided between the sharing FET 102 and the first main channel transistor 106. The gain feedback sensing node 22 measures the effective gain of the sharing FET 102 and feeds the gain information back to the analog control sharing control module 14. In this manner, analog control sharing control block 14 can monitor the effective gain of the sharing FET 102 and adjust a gate signal 218, thereby adjusting the resistance of the respective channel 100 (e.g., channel 3) so that current flowing through the respective channel 100 is balanced with respect to one or more of the remaining channels (e.g., 6, 9 and 12).

According to a non-limiting embodiment, the sharing FET 102 is controlled via an analog control signal. For example, the analog control sharing control module 14 includes an analog signal driver circuit that generates a pulse-width modulated (PWM) gate signal 218. The pulse width of the PWM signal 218 varies the impedance of the sharing FET 102, which in turn controls the overall resistance of the channel 100. For example, disconnecting the gate signal 218 from the sharing FET 102 disables (i.e., switches off) the sharing FET 102, and generates a fixed resistance in the channel 100. When a PWM gate signal 218 is generated by the analog control sharing control module 14 and applied to the gate of the sharing FET 102, the sharing FET 102 is enabled (i.e., switched on) such that the resistance of the SSPC channel 100 is reduced. As the analog control sharing control module 14 increases the pulse width of PWM gate signal 218, the sharing FET 102 is driven toward saturation such that the channel 100 realizes the least amount of resistance. The sharing FET may be controlled according to an analog control loop, a DAC, or various other methods of controlling the FET 102.

Figure 3:
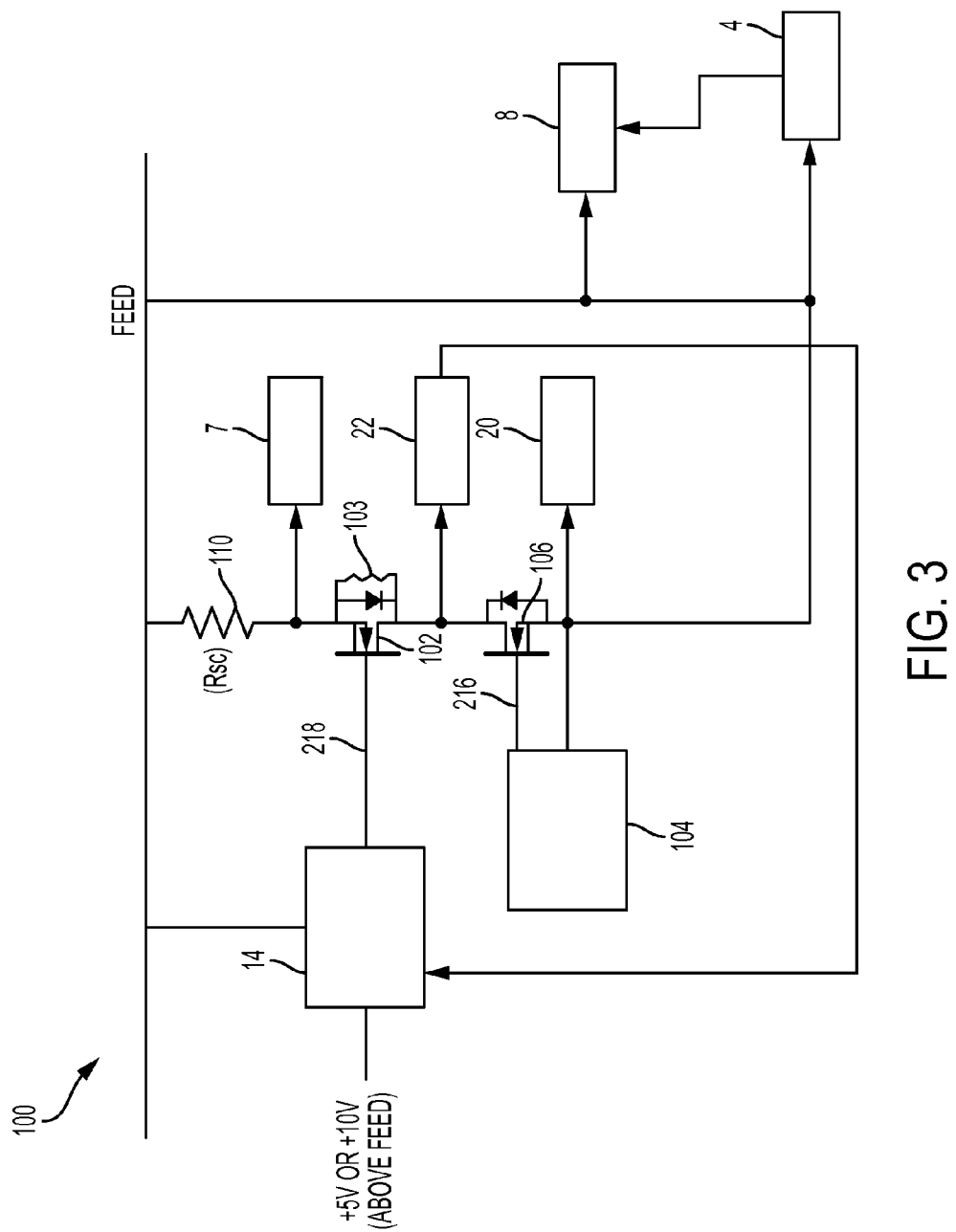
FIG. 3 is a schematic illustrating a multi-channel platform balancing parallel SSPC channel current system including an electronic analog sharing control unit that controls an impedance of a sharing field effect transmitter (FET) to control sharing of an individual DC SSPC according to a non-limiting embodiment.

Turning now to FIG. 3, a SSPC channel 200 including a digital sharing control module 14, and a digital-based current balancing device having a plurality of sharing FETs 102a-102c that provide selective channel resistance is illustrated according to a non-limiting embodiment. The plurality of sharing FETs 102a-102c are connected in parallel with one another. Although three sharing FETs 102a-102c are illustrated, any number of sharing FETs 102n greater than one sharing FET can be implemented. For instance, each sharing FET 102a-102c shares a common source and a common drain, while having gates that independently receive a respective gate signal. Unlike the analog-based sharing FET 102 described above, each sharing FETs 102a-102c is selectively enabled (i.e., switched on) or disabled (i.e., switched off) in response to receiving an independent digital control signal 220a-220c generated by the digital sharing control module 14. In this manner, the overall resistance of the SSPC channel 200 decreases as more FETs 102a-102c are enabled, with least resistance occurring when all the sharing FETs 102a-102c are enabled.

According to an embodiment, the digital sharing control module 14 comprises a digital electronic field programmable gate array (FPGA) or any other type of digital logic or digital microcontroller in signal communication with the gates of a respective sharing FETs 102a-102c. In this manner, the digital sharing control module 14 can generate an active-high signal, for example, to enable a respective sharing FET 102a-102c, or an active-low signal, for example, to disable a respective sharing FET 102a-102c.

The SSPC channel 200 may further include a sharing resistor 222 connected in parallel with the plurality of sharing FETs 102. The sharing resistor 222 defines a fixed max resistance of the SSPC channel 200. Accordingly, the sharing FETs 102a-102c can be enabled in various combinations to vary the overall resistance of the SSPC channel 200. For example, when all the sharing FETs 102 are disabled, the SSPC channel 200 realizes a max fixed resistance defined by the sharing resistor 222. Turning on one of the sharing FETs (e.g., FET 102a), reduces the resistance of the SSPC channel 200, while enabling all the sharing FETS 102a-102c provides the least resistance in the SSPC channel 200. In addition, the sharing FETs 102a-102c need not be equal in value. In this manner, a larger range of adjustment may be achieved.

Similar to the SSPC channel 100 discussed above, the SSPC channel 200 including the digital-based current balancing device may include one or more measurement or sensing nodes. For example, the SSPC channel 200 may include a sensed channel current output node 7, a sensed channel voltage output node 8, a main transistor voltage sensing node 20, and a gain feedback sensing node 22. The sensed channel current output node 7 measures current flowing through a current sense resistor 110, which is indicative of the current flowing through the SSPC channel 200. The sensed channel voltage output node 8 measures the voltage across the main power feed and the load 4, which is indicative of the voltage across the SSPC channel 100. The main transistor voltage sensing node 20 is connected between the first main channel transistor 106 and the second main channel transistor 108.

The gain feedback sensing node 22 may also be provided between the sharing FET 102 and the first main channel transistor 106. The gain feedback sensing node 22 measures the effective gain of the sharing FET 102 and feeds the gain information back to the digital control sharing control module 14. In this manner, the digital control sharing control module 14 can monitor the effective gain of the sharing FET 102 and adjust gate signals 220a-220c, thereby adjusting to resistance of the respective channel 100 (e.g., channel 3) so that current flowing the respective channel 100 is balanced with respect to one or more of the remaining channels (e.g., 6, 9 and 12). In other words, information necessary to balance the current among all the SSPC channels (e.g., 3, 6, 9, 12) can be dynamically controlled by an algorithm to track a control parameter or stay on one side of a control parameter (active limiter operation). According to another embodiment, the current feedback 7 can also be used to determine if one or more channels are being correctly shared, i.e., to determine whether the current distribution among the channels 3, 6, 9, 12 is correctly balanced.

According to another embodiment, the gain feedback sensing node 22 can be omitted. In this case, current balance information regarding how local channel current of the SSPC channel 200 correctly coordinates with the SSPC channel's own secondary protection in order to maintain thermal balance between power dissipation between all the channels (e.g., 3, 6, 9, 12) can be stored locally as configuration data during module manufacturing. In addition, current balance information can be configured during power-up sequencing.

Figure 4:
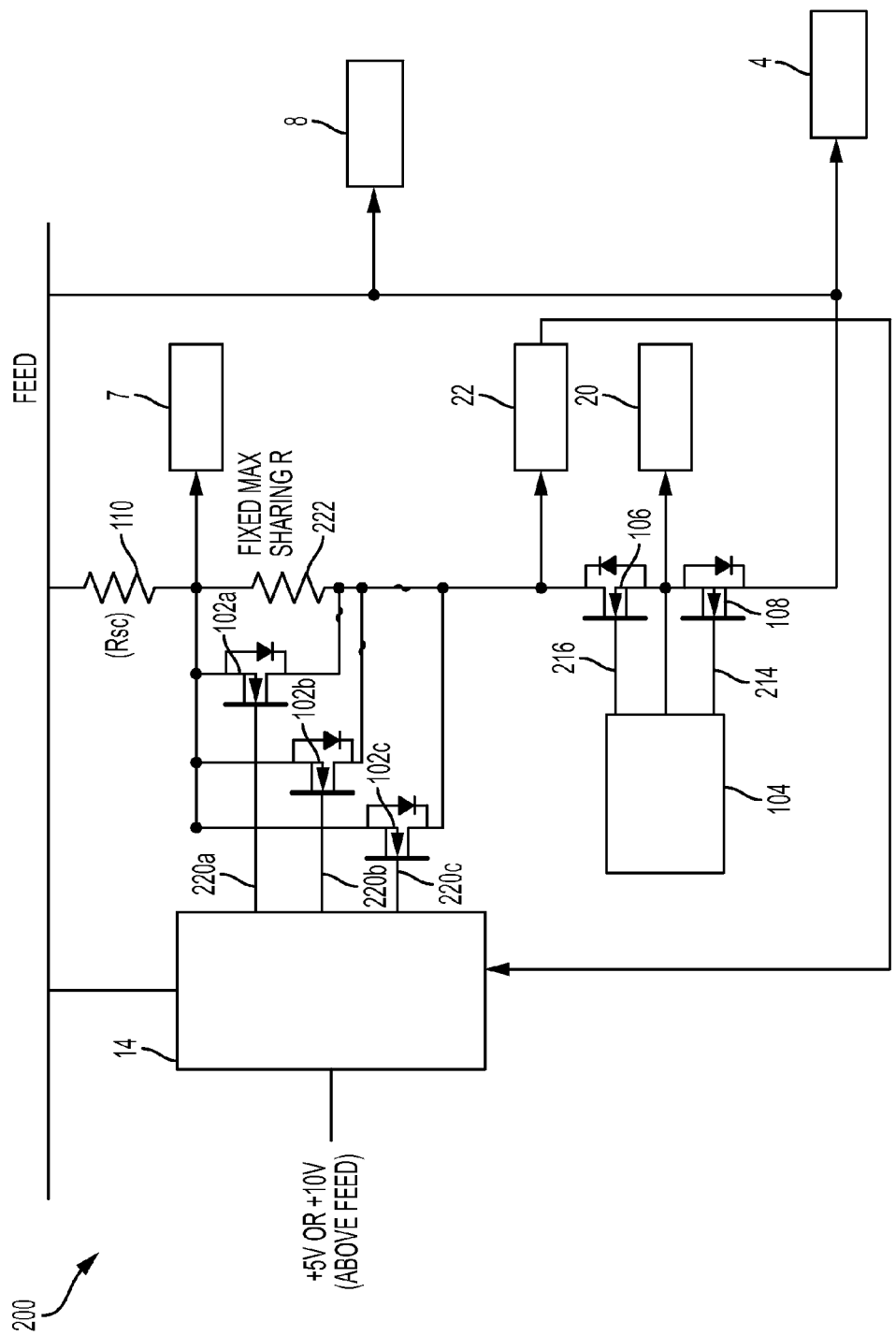
FIG. 4 is a schematic illustrating a multi-channel platform balancing parallel SSPC channel current system that controls an AC channel, and that includes an electronic digital sharing control unit that selectively enables one or more sharing FETs to balance the system according to a non-limiting embodiment.
Figure 5:
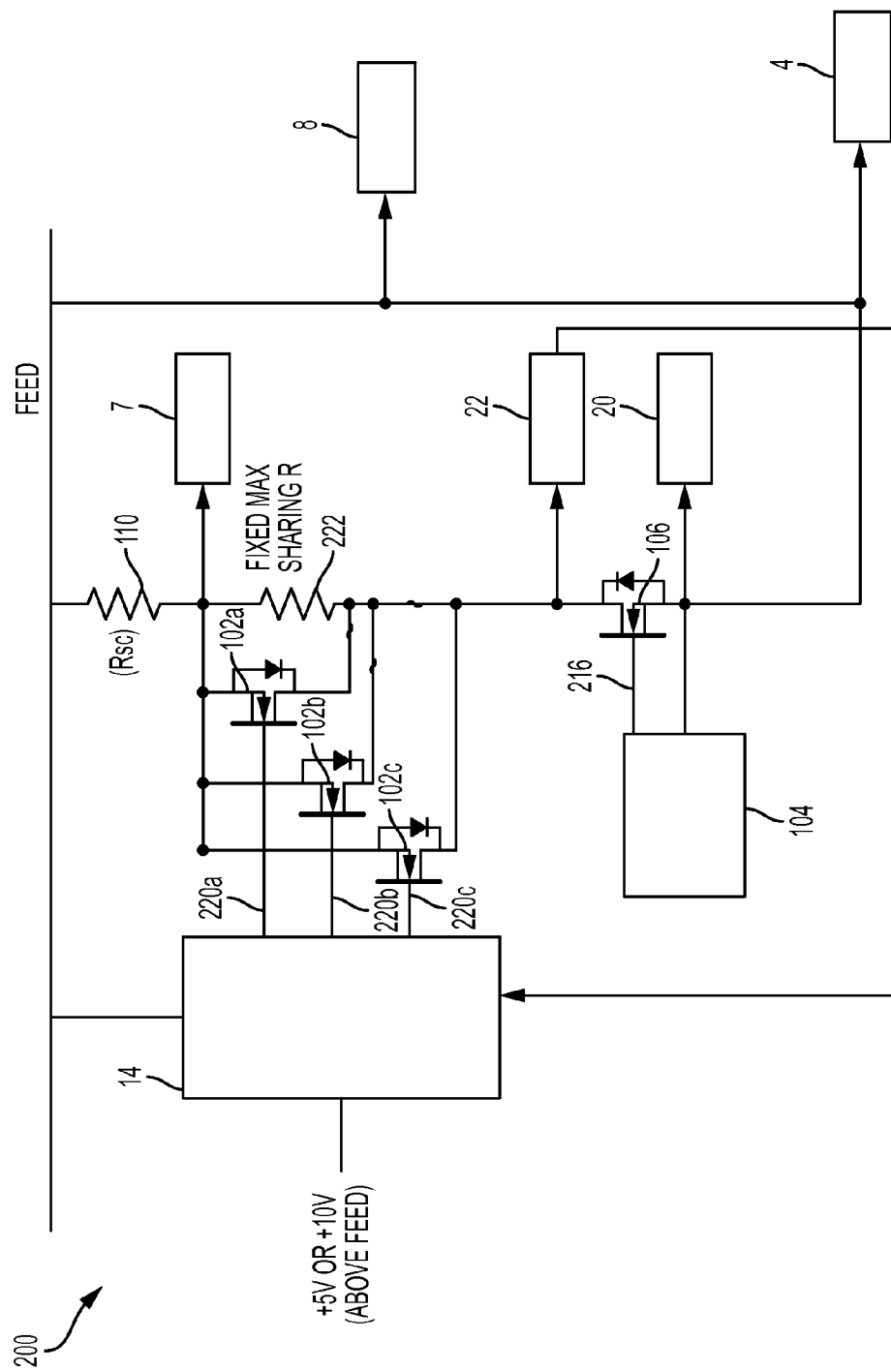
FIG. 5 is a schematic illustrating a multi-channel platform balancing parallel SSPC channel current system that controls a DC channel, and that includes an electronic digital sharing control unit that selectively enables one or more sharing FETs to balance the system according to a non-limiting embodiment.

According to another non-limiting embodiment illustrated in FIG. 4, the a SSPC channel 200 can include a digital sharing control module 14, and a digital-based current balancing device having a plurality of sharing FETs 102a-102c that provide selective channel resistance is illustrated according to a non-limiting embodiment. The SSPC channel 200 operates similar to the SSPC channel 200 illustrated in FIG. 3. In this embodiment, however, a DC SSPC is provided. The DC SSPC may be selectively enabled and/or disabled using a main channel transistor 106 that switched on or off in response to a channel control signal 216 output from electronic main channel controller 104.

As used herein, the term module or electronic unit refers to a hardware module including an Application Specific Integrated Circuit (ASIC), for example, an electronic circuit, a computer processor (shared, dedicated, or group) which can execute one or more software or firmware programs, a combinational logic circuit, a FPGA, an electronic microcontroller and/or other suitable components that provide the described functionality stored on electronic memory. In at least one embodiment of the present disclosure, a module may include a microcontroller as understood by those ordinarily skilled in the art.

While various embodiments have been described in detail in connection with only a limited number of embodiments, it should be readily understood that the features described above are not limited to such disclosed embodiments. Rather, the embodiments can be modified to incorporate any number of variations, alterations, substitutions or equivalent arrangements not heretofore described, but which are commensurate with the spirit and scope of the invention. Additionally, while various embodiments have been described, it is to be understood that aspects of the embodiment may include only some of the described embodiments. Accordingly, the described embodiments are not to be seen as limited by the foregoing description.

What is claimed is:

1. A solid-state power controller system comprising:
a single power source including at least two output channels connected in parallel, the at least two output channels including a first output channel to deliver a first current therethrough to a load, and a second output channel to deliver a second current therethrough to the load, the second output channel connected in parallel with the first output channel;
at least one solid-state power controller including:
at least one first main control transistor connected in series along the first output channel to control the first current output to the load;
at least one first electronic current balancing device configured to regulate current delivered to the at least one first main control transistor;
at least one second main control transistor connected in series along the second output channel to control the second current output to the load; and
at least one second electronic current balancing device configured to regulate current delivered to the at least one second main control transistor; and
an electronic controller in electrical communication with the first solid-state power controller and the second solid-state power controller, the electronic controller configured to determine a strength of the first and second currents, and to control at least one of the at least one first electronic current balancing device and the at least one second electronic current balancing device to maintain that the first current flowing through the first channel is equal to the second current flowing through the second channel.

2. The solid-state power controller system of claim 1, wherein the at least one first and second electronic current balancing devices are connected in series between the power source, and the at least one first main control transistor and the at least one second main control transistor, respectively.

3. The solid-state power controller system of claim 1, wherein the at least one first and second electronic current balancing devices are connected in series between the load, and the at least one first main control transistor and the at least one second main control transistor, respectively.

4. The solid-state power controller system of claim 1, wherein the at least one solid-state power controller includes:
a first solid-state power controller having an electronic first sharing controller that controls the at least one first current balancing device; and
a second solid-state power controller having an electronic second sharing controller that controls the at least one second current balancing device.

5. The solid-state power controller of claim 4, wherein the electronic controller determines that the first current flowing through the first output channel does not equal the second current flowing through the second output channel, and generates a balance control signal that commands at least one of the first sharing controller and the second controller to adjust an impedance of at least one of the first balancing device and the at least second current balancing device, respectively, to balance the first current flowing through the first output channel with respect to the second current flowing through the second output channel.

6. The solid-state power controller system of claim 5, wherein the at least one first electronic current balancing device includes a single sharing field effect transistor (FET), and the at least one second electronic current balancing device includes a second single sharing FET.

7. The solid-state power controller of claim 6, wherein the first and second single sharing FETs are configured to operate in response to receiving an analog control signal.

8. The solid-state power controller of claim 7, wherein the first sharing controller includes a first analog gate driver that generates a first pulse-width-modulated (PWM) gate signal that selectively drives the first sharing FET, and the second sharing controller includes a second analog gate driver that generates a second pulse-width-modulated (PWM) gate signal that selectively drives the second sharing FET.

9. The solid-state power controller of claim 8, wherein at least one of the first sharing controller and the second sharing controller adjust the pulse width of the first and second PWM gate signal, respectively, in response to receiving the balance control signal.

10. The solid-state power controller of claim 5, wherein the at least one first electronic current balancing device includes a plurality of first sharing FETs, and the at least one second electronic current balancing device includes a plurality of second sharing FETs.

11. The solid-state power controller of claim 10, wherein the first sharing FETs are connected in parallel with respect to one another, and the second sharing FETs are connected in parallel with respect to one another.

12. The solid-state power controller of claim 11, wherein the first sharing controller generates at least one first channel digital signal having a first state or a second state to selectively enable or disable a respective first sharing FET among the plurality of first sharing FETs, and wherein the second sharing controller generates at least one second channel digital signal having a first state or a second state to selectively enable or disable a respective second sharing FET among the plurality of second sharing FETs.

13. The solid-state power controller of claim 12, wherein at least one of the first sharing controller and the second sharing controller adjusts a combination of enabled first and second sharing FETs, respectively, in response to receiving the balance control signal.

14. The solid-state power controller of claim 13, wherein a first combination of enabled first sharing FETs adjusts a total first impedance generated by the first sharing FETs, and wherein a second combination of enabled second sharing FETs adjusts a total second impedance generated by the second sharing FETs.

15. The solid-state power controller of claim 14, wherein the total first impedance adjusts a first resistance applied to the first current flowing through the first output channel, and wherein the combination of enabled first sharing FETs adjusts and a second resistance applied to the second current flowing through the second output channel.

16. A method of balancing current flowing through a solid-state power controller system including at least two output channels connected in parallel, the method:
- delivering a first current to a load via a first output channel included in a single power source, and delivering a second current to the load via a second output channel included in the single power source, the second output channel connected in parallel with the first output channel;
- determining a first strength of the first current and a second strength of the second current; and
- adjusting at least one of a first resistance of the first output channel and a second resistance of the second output channel such that the first current strength is equal to the second current strength.

17. The method of claim 16, further comprising controlling at least one first current balancing component coupled to the first output channel and interposed between a power supply and the load to adjust the first resistance, and controlling at least one second current balancing component coupled to the second output channel and interposed between a power supply and the load to adjust the second resistance.

18. The method of claim 17, further comprising:
- determining that the first current flowing through the first output channel does not equal the second current flowing through the second output channel; and
- adjusting an impedance of at least one of the first and second current balancing components, respectively, to balance the first current flowing through the first output channel with respect to the second current flowing through the second output channel.

19. The method of claim 18, further comprising generating a first analog signal to control the at least one first current balancing component, and generating a second analog signal to control the at least one second current balancing component.

20. The method of claim 18, further comprising generating at least one first digital signal to control the at least one first current balancing component, and generating at least one second digital signal to control the at least one second current balancing component.

* * * * *